United States Patent
Ohmi et al.

(10) Patent No.: US 6,258,411 B1
(45) Date of Patent: Jul. 10, 2001

(54) INDUSTRIAL MATERIAL WITH FLUORINE PASSIVATED FILM AND PROCESS OF MANUFACTURING THE SAME

(75) Inventors: Tadahiro Ohmi, Sendai; Kazuo Chiba; Yutaka Mikasa, both of Mishima; Kenji Ishigaki, Susono; Nobuhiro Miki, Ohsaka; Matagoro Maeno, Izumi; Hirohisa Kikuyama, Nara, all of (JP)

(73) Assignees: Mitsubisi Aluminum Company, Ltd., Tokyo (JP); Hashimoto Chemical Corporation, Ohsaka (JP)

( * ) Notice: Subject to any disclaimer, the term of this patent is extended or adjusted under 35 U.S.C. 154(b) by 0 days.

(21) Appl. No.: 09/300,773

(22) Filed: Apr. 27, 1999

Related U.S. Application Data

(63) Continuation of application No. 08/051,001, filed on Apr. 21, 1993, now abandoned, which is a continuation of application No. 07/665,767, filed on Mar. 7, 1991, now abandoned.

(30) Foreign Application Priority Data

| Mar. 9, 1990 | (JP) | 2-059443 |
| Jul. 4, 1990 | (JP) | 2-177172 |
| Oct. 19, 1990 | (JP) | 2-283150 |
| Oct. 19, 1990 | (JP) | 2-283151 |
| Dec. 21, 1990 | (JP) | 2-405131 |

(51) Int. Cl.$^7$ ................ B05D 3/04; C23C 8/06
(52) U.S. Cl. ............ 427/304; 148/283; 205/205; 205/210; 205/258; 427/305; 427/253; 427/255.17; 427/255.39; 427/328; 427/404; 427/405; 428/469; 428/936; 428/938

(58) Field of Search .................. 427/304, 305, 427/253, 255.17, 255.39, 328, 404, 405; 205/205, 210, 258; 428/621, 628, 649, 652, 656, 679, 680, 936, 938, 469; 148/283

(56) References Cited

U.S. PATENT DOCUMENTS

| 4,397,812 | * | 8/1983 | Mallory, Jr. ................. 420/441 |
| 5,009,963 | | 4/1991 | Ohmi et al. .................. 428/472.2 |

FOREIGN PATENT DOCUMENTS

| 0352061 | * | 1/1990 | (EP) . |
| 59-13065 | | 1/1984 | (JP) . |

* cited by examiner

*Primary Examiner*—Deborah Jones
*Assistant Examiner*—Robert R. Koehler
(74) *Attorney, Agent, or Firm*—Charles N. Quinn; Saul Ewing LLP

(57) ABSTRACT

An industrial material such as metal, ceramics or plastics whose surface has a film passivated by fluoridation and a process of manufacturing the above industrial material. The industrial material comprises a substrate, a nickel alloy film formed on the substrate and containing nickel, semimetal and/or other metal whose fluoride becomes a volatile compound, and a fluorine passivated film formed at least on a surface of the nickel alloy film in such a manner that the fluorine passivated film contains nickel and does not contain said other metal or the semimetal, and satisfies stoichiometric ratio. The process of manufacturing an industrial material comprises the steps of performing grounding treatment of a surface of a substrate, forming a nickel alloy film, on the surface of the substrate, containing nickel, semimetal and/or other metal, and forming a fluorine passivated film on the nickel alloy film.

7 Claims, 4 Drawing Sheets

FIG. 4
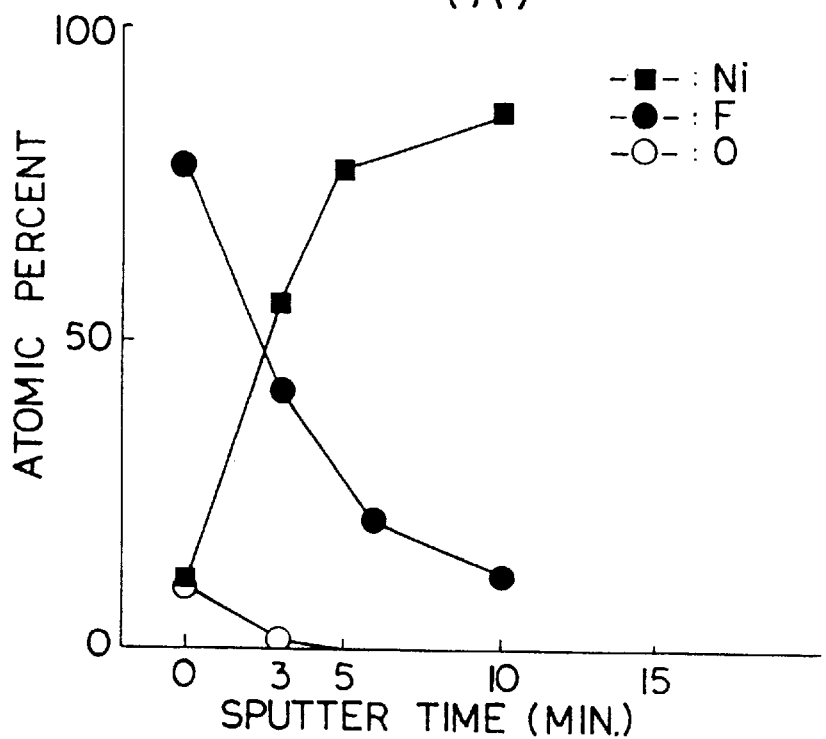
(A)
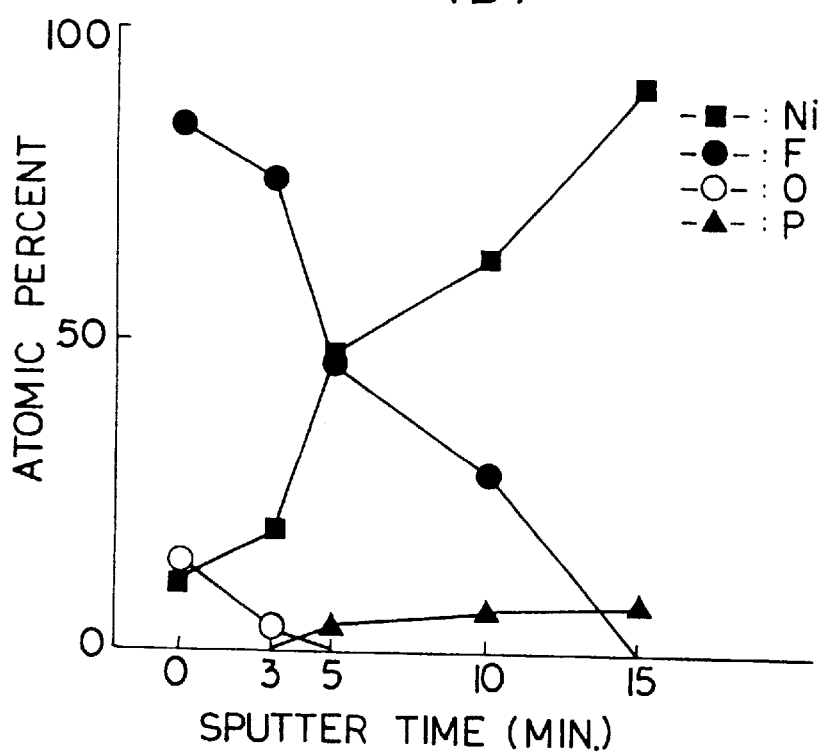
(B)

INDUSTRIAL MATERIAL WITH FLUORINE PASSIVATED FILM AND PROCESS OF MANUFACTURING THE SAME

RELATED APPLICATIONS

This application is a continuation of applicant's U.S. patent application Ser. No. 08/051,001, filed Apr. 21, 1993, entitled "Industrial Material with Fluorine Passivated Film and Process of Manufacturing the Same," now abandoned, which application is a file wrapper continuation of U.S. patent application Ser. No. 07/665,767, filed Mar. 7, 1991, entitled "Industrial Material with Fluorine Passivated Film and Process of Manufacturing the Same" (abandoned).

BACKGROUND OF THE INVENTION

The present invention relates to an industrial material with fluorine passivated film and process of manufacturing the same, and more particularly to an industrial material such as metal, ceramics or plastics whose surface has a film passivated by fluoridation and which is preferably applicable to a manufacturing field of semiconductors, and to a process of manufacturing the above industrial material.

In general, in the process of manufacturing semiconductors, specific gases of high reactivity and corrosiveness such as $BCl_3$, $SiF_4$, $WF_4$, or the like are used, and therefore hydrolysis occurs under the atmosphere of moisture, resulting in generation of highly corrosive acid such as hydrogen chloride, hydrogen fluoride or the like. Accordingly, when using some metal material such as aluminum or aluminum alloy as storage containers, pipelines, reaction chambers and the like for treating the above gases, there unavoidably arises a serious problem that such metal material is caused to corrode easily.

Recently, semiconductor devices have been small-sized to improve integration thereof, and various researches and developments have been made so that semiconductor devices are small-sized in the range of 1 $\mu$m to submicron of smaller than 0.2 $\mu$m may be put into practical use.

In order to improve the integration of semiconductor devices, it is necessary for semiconductors to be manufactured by the process which is kept at low temperature and with high selectivity in terms of material of substrate, thus a highly purified process atmosphere is required. In the case where an apparatus necessary for such a highly purified process atmosphere corrodes slightly, impurities produced as a result of such corrosion may be mixed with wafer of semiconductor devices, resulting in deterioration of quality of film and making it impossible to achieve accuracy of fine processing. Consequently, reliability essential for ultra-fine semiconductor devices, i.e., ULSI is lowered.

Further, in the field of excimer laser using a laser containing rare gases such as argon, krypton or xenon, or halogen gases together with rare gases, a laser oscillator is caused to corrode by fluorine due to corrosion of inside of the apparatus, thus shortening the life of the apparatus.

Furthermore, in the apparatus for treating particular halogen gas such as RIE performing directional chemical etching which is used for manufacturing integrated circuits, or CVD performing chemical vacuum evaporation to precipitate a film of reaction product by feeding a volatile compound of material to be precipitated onto the substrate and then pyrolysis or reaction thereof, the employed gas is reacted with moisture absorbed on metal surface or oxidation film of metal surface, thus generating secondary corrosive gas and resulting in secondary pollution of atmosphere in the apparatus.

In order to solve the above drawbacks, conventionally, a grounding film is formed on the metal surface by means of electroplating, vacuum evaporation or sputtering or the like, fluorine passivated film is formed on the grounding film of the metal surface, thereby preventing the metal surface from being corroded by the above-mentioned secondary corrosive gas. Such technology is disclosed in, for example, the Laid-Open patent publications No. 2-175855, No. 2-263972.

However, since the semiconductor manufacturing apparatuses, the excimer laser, and pipes attached to the apparatuses have mostly complicated shape, the grounding film cannot be uniformly formed on the inside surface of the apparatuses by means of electroplating, vacuum evaporation or sputtering or the like. Consequently, the fluorine passivated film cannot be formed on the grounding film, sufficient corrosion resistance to corrosive gas of the halogen series cannot be obtained.

Further, in the field of manufacturing semiconductors, in the case of where phosphorus is exposed on the metal surface, there occurs doping upon sputtering. Therefore, it is necessary not to expose phosphorus on the metal surface.

On the other hand, in the process of manufacturing semiconductors, nonmetal material such as plastics, ceramics or the like besides the above-mentioned metal material is used. When using the nonmetal material in the process of manufacturing semiconductors, it is necessary to form fluorine passivated film on the surface of the material to prevent gas from being released from the surface of the material or to obtain conductivity. Incidentally, in case of plastics, the fluorine passivated film must be also formed on the surface of the material from the viewpoint of corrosion resistance.

SUMMARY OF THE INVENTION

It is therefore an object of the present invention to provide an industrial material with fluorine passivated film which can extremely improve corrosion resistance to corrosive gas in metal material or plastics and can prevent gas from being released from the surface of the material and obtain conductivity, and which is effectively applicable to the field of manufacturing semiconductors.

Another object of the present invention is to provide a process of manufacturing the above industrial material with fluorine passivated film.

According to one aspect of the present invention, there is provided an industrial material comprising: a substrate; a nickel alloy film formed on the substrate and containing nickel, semimetal and/or other metal whose fluoride becomes a volatile compound; a fluorine passivated film formed at least on a surface of the nickel alloy film in such a manner that the fluorine passivated film contains nickel and does not contain said other metal or the semimetal, and satisfies stoichiometric ratio.

According to the above industrial material, the nickel alloy film comprising nickel, other metal such as tungsten or semimetal such as phosphorus, boron is formed on the substrate comprising metal such as pure metal or alloy thereof, or nonmetal such as plastics or ceramics as grounding treatment prior to forming a fluorine passivated film, and the fluorine passivated film is formed on the nickel alloy film, thereby forming extremely stable nickel alloy film by the action of said other metal such as tungsten or semimetal such as phosphorus, boron which form an alloy film together with nickel. Further, a thick and stable fluorine passivated film can be formed by the action of said other metal or semimetal contained in the nickel alloy film.

Further, when forming the fluorine passivated film, nickel contained in the nickel alloy film reacts with fluorine, and said other metal such as tungsten or semimetal such as phosphorus, boron contained in the alloy plating film reacts with fluorine. Said other metal such as tungsten or semimetal such as phosphorus, boron, and fluorine form a volatile compound (fluoride) having a low boiling point, and then the volatile compound is sublimated and discharged. Therefore, said other metal such as phosphorus, boron, tungsten, or semimetal is not contained at least on the surface of the fluorine passivated film, the fluorine passivated film is applicable to the industrial material in semiconductor manufacturing field without any bad influence.

According to another aspect of the present invention, there is provided a process of manufacturing an industrial material comprising the steps of: performing grounding treatment of a surface of a substrate; forming a nickel alloy film on the surface of the substrate, the nickel alloy film comprising nickel, semimetal and/or other metal; and forming a fluorine passivated film on the nickel alloy film.

With the above process, in the case where the nickel alloy film comprising nickel, semimetal and/or other metal is formed by, especially, electroless plating, a plating film having uniform thickness is formed of the apparatuses or pipes having very complicated shapes.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 4(A) is a diagram showing distribution condition of fluorine after forming pure nickel film on the substrate and fluoridation thereof; and FIG. 4(B) is a diagram showing distribution condition of fluorine after forming nickel-phosphorus alloy film on the substrate and fluoridation thereof.

DESCRIPTION OF THE PREFERRED EMBODIMENTS

Figure 1:
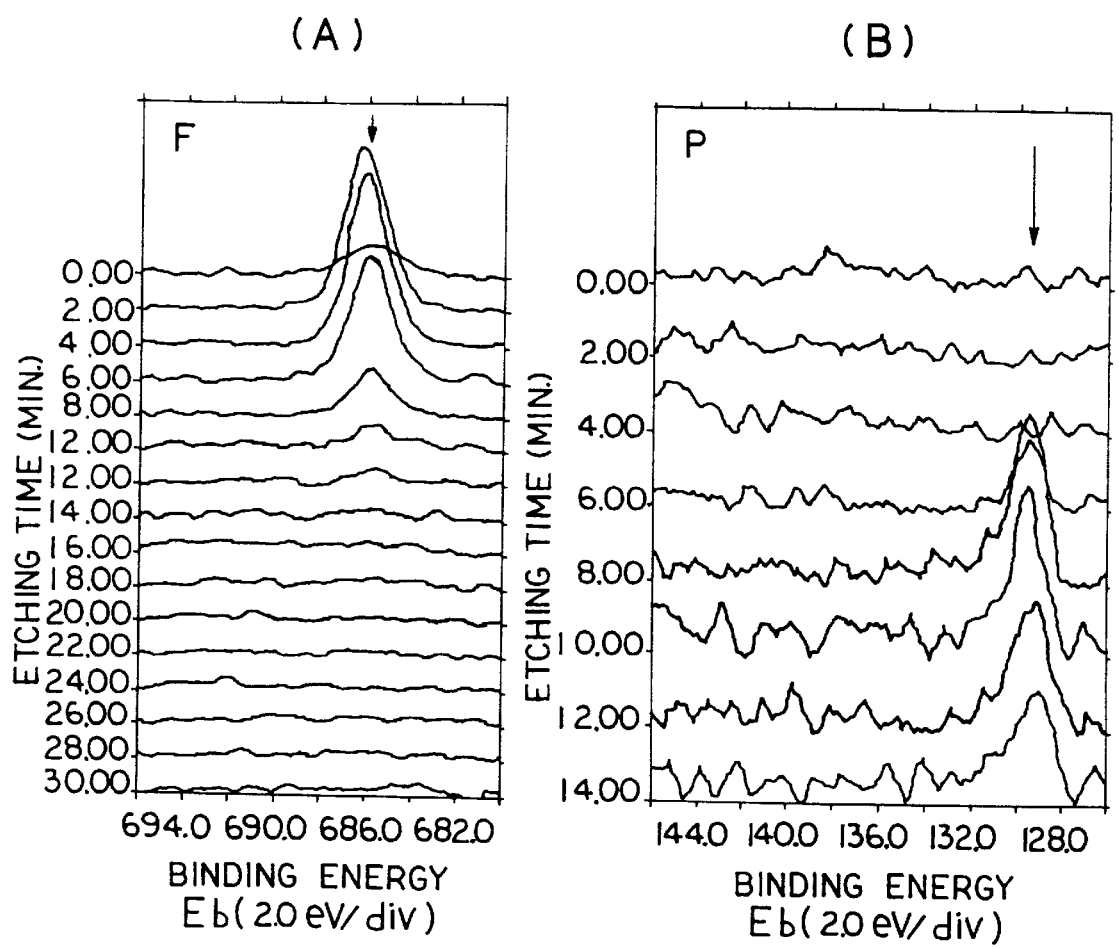
FIG. 1(A) is a diagram showing distribution condition of fluorine.
FIG. 1(B) is a diagram showing distribution condition of phosphorus.

An industrial material with fluorine passivated film and process of manufacturing the same according to an embodiment of the present invention will be described below with reference to drawings.

In this embodiment, metal or nonmetal such as plastics or ceramics can be used as a substrate on which fluorine passivated film is formed. Metal useful for the substrate are aluminum, aluminum alloy, titanium, titanium alloy, ferrous, ferrous alloy such as stainless steel, copper, copper alloy, magnesium, magnesium alloy or any other alloy. Aluminum alloy useful for the substrate are AA2219, AA5052, AA5086, AA6061, AA6063, JIS-A7N01. Titanium alloy useful for the substrate are alloy containing not less than 99.0% of titanium (MIL T-9047B-1), Ti-6A1-4V (MIL T-9046B-2), Ti-5A1-2.5Sn (MIL T-9057B-2). JIS G4303 to 4312 are used as stainless steel.

On the other hand, plastics such as ABS resin, ceramics, or composite material containing metal and plastics and/or ceramics are used as the substrate on which fluorine passivated film is formed.

Next, a process of manufacturing an industrial material with fluorine passivated film will be described below.

First, the grounding treatment is performed on the substrate. In case of aluminum or aluminum alloy as the substrate, this grounding treatment is performed by removing grease on the substrate surface using a surface active agent or tetrachloroethylene in order to remove oxidation film on the substrate surface and form uniform grounding film, and then by removing grease by non-etching in acid solution or alkali solution or weak-etching with less than 0.1 $g/dm^2$ removal of substrate surface. This is because harmful pits are easily formed at the area where relatively large intermetallic compounds exist when performing etching of more than 0.1 $g/dm^2$ removal of substrate surface, therefore, harmful micro-defects are subsequently formed on the nickel alloy film comprising nickel-phosphorus or on the fluorine passivated film.

Next, zincating treatment is performed by soaking the substrate surface in alkali sodium zincate solution because it is difficult to plate directly on the substrate surface, having extremely active surface condition after removal of grease, comprising aluminum or aluminum alloy. In this case, after performing zincating treatment once, the substrate is soaked in 50% $HNO_3$ solution at room temperature for 30 seconds to remove thin film of zinc, and then zincating treatment is performed again to thereby obtain fine film with high adhesion (so-called double zincating treatment).

In case of titanium or titanium alloy as the substrate, since titanium or titanium alloy is chemically stable and it is difficult to plate directly on the substrate, first, the grounding treatment is performed by mechanical treatment such as shot blasting to make surface roughness rough, and then by etching in the mixed solution of nitric acid and fluoric acid and activating the substrate surface in the mixed solution of dichromic acid and fluoric acid, thereby obtaining fine film with high adhesion.

In case of stainless steel as the substrate, the grounding treatment is performed by removing grease in alkaline solution, and then by etching in the hydrochloric acid solution to activate the substrate surface, and further by strike nickel plating in Watt bath to improve adhesion.

After the grounding treatment, nickel alloy film comprising nickel, semimetal and/or metal is formed on the substrate. In this embodiment, nickel-phosphorus plating as an example of nickel alloy film is applied to the surface of substrate comprising aluminum or aluminum alloy by electroless plating, and this process will be explained below.

First, electroless nickel-phosphorus plating is performed on the substrate having pretreatments as mentioned above in the solution containing main ingredients of $NiSO_4$ (metallic salts) and $NaH_2PO_2$ (reducing agent), and accessory ingredients of organic acid (chelating agent) and stabilizer. This electroless plating is performed by precipitating metallic ions using reducing agent without external power source, therefore, the nickel-phosphorus plating having uniform film is formed on the inner surface of containers or the apparatuses having complicated shape. In case of, for example, electroplating, even if using supplementary electrodes, current density distribution varies depending on the place of electrodes, that is, current density distribution at the place where plating metal precipitates easily is different from current density distribution at the place such as corner portion where plating metal does not precipitate easily. As a result, the thickness of plating film differs more than 10 times depending on the places. However, in case of electroless plating mentioned above, dispersion of average thickness of plating film can be controlled in the range of +5% by stirring of solution or circulation of liquid.

According to conventional electroplating, in order to obtain plating film having thickness of 1 $\mu$m at the thinnest place, plating film having thickness of at least 10 $\mu$m must be formed on the inner surface of the apparatuses with complicated shape such as semiconductor manufacturing apparatuses. By contrast, in case of electroless plating, nickel-phosphorus plating film having thickness of 1.5 $\mu$m is sufficient. Further, the nickel-phosphorus plating film contains phosphorus to thus form extremely stable plating.

In this embodiment, practical thickness of the electroless nickel-phosphorus plating film is not less than 1 $\mu$m, preferably not less than 2 $\mu$m as grounding. In electroless nickel-phosphorus plating using $NaH_2PO_2$ as reducing agent, phosphorus of not less than 1 weight % is codeposited. Consequently, film hardness becomes high, that is, Vickers hardness reaches Hmv 500 to 600. By contrast, in case of normal electro-nickel plating, film hardness is Hmv 150 to 250. The electroless plating is far superior to the electro-nickel plating in wear resistance and durability against physical damage. Accordingly, durability of flange using metal packing or sliding portions of gas devices is remarkably improved.

It is possible to use electroplating in place of non-electrolytic plating to form nickel-phosphorus film on the substrate. Further, it is possible to rely on dry process besides the above wet process. The dry process includes physical vapor deposition (PVD) such as sputtering or ion plating, heat vapor deposition and chemical vapor deposition (CVD) such as plasma vaporization. When forming nickel-phosphorus film by any other process except for electroless plating, it is suitable for the object having relatively uncomplicated shape.

On the other hand, nickel-boron, nickel-tungsten-phosphorus in addition to nickel-phosphorus is utilized as nickel alloy film comprising nickel, semimetal and/or other metal.

The grounding treatment of the substrate finishes by the process mentioned above. This grounding treatment is indispensable for forming of uniform fluorine passivated film.

Further, in this embodiment, the substrate having grounding treatment is etched for about 1 minute in 1% HF solution. Next, the substrate is washed by water and dried for release of gas from the inside of the substrate and decontamination of the surface thereof, and then baked in inert gas such as $N_2$. Thereafter, the substrate is fluoridized to form fluorine passivated film comprising metallic fluoride ($NiF_2$), and then the substrate is heat-treated in inert gas. The fluoridation is carried out under pressure of normal pressure or less than 2 atmospheric gauge pressure in 100% $F_2$ gas atmosphere or $F_2$ gas atmosphere containing $H_2O$ less than 0.1 volume ppm.

The baking temperature is 200° C. to 390° C., preferably 250° C. to 350° C. The baking time is 1 to 5 hours. The fluoridation temperature is 200° C. to 390° C., preferably 250° C. to 380° C. The fluoridation time is 1 to 5 hours. The heat treatment temperature is 250° C. to 390° C., preferably 330° C. to 380° C. This heat treatment is carried out for 1 to 5 hours in inert gas such as $N_2$, Ar or He, thereby forming stable and fine fluorine passivated film having high corrosion resistance to corrosive gas such as halogen gas.

As mentioned above, the upper limit of baking temperature, fluoridation temperature and heat treatment temperature are set at 390° C. This is because if the heat treatment is carried out at temperature of more than 400° C., the nickel-phosphorus plating film cracks or is peeled off due to difference of coefficient of thermal expansion between the nickel-phosphorus plating film formed by the grounding treatment and the aluminum substrate, thereby making corrosion resistance of the fluorine passivated film insufficient.

Further, the lower limit of the fluoridation temperature is set at 200° C. This is because the film having sufficient thickness and high corrosion resistance cannot be obtained at temperature of less than 200° C. Between 250° C. and 380° C., the thickness of fluorine passivated film can be controlled in proportion to temperature, therefore, the fluoridation temperature is preferably 250° C. to 380° C.

In this embodiment, since the fluorine passivated film is formed on the nickel-phosphorus plating film, the thickness of the fluorine passivated film becomes more than 200 A, preferably more than 300 A by the action of phosphorus contained in the nickel-phosphorus plating film. Therefore, the fluorine passivated film is not easily peeled off from the substrate.

In the case where phosphorus is exposed on the surface of the fluorine passivated film, phosphorus is doped by sputtering, thereby exerting a bad influence upon quality of articles in the semiconductor manufacturing field. Phosphorus contained in the electroless nickel-phosphorus plating film forms a compound with fluorine, but this compound has a low boiling point and is volatile. Accordingly, this compound is immediately sublimated and discharged, phosphorus is not contained at least on the surface of the fluorine passivated film, therefore the compound does not exert a bad influence upon quality of articles in the semiconductor manufacturing field.

In this embodiment, as grounding treatment before forming fluorine passivated film, the substrate is washed to remove grease from the surface thereof, and then the zincating treatment is performed on the substrate, the non-electrolytic nickel-phosphorus plating film is formed on the substrate. Therefore, the plating film formed on the substrate becomes more uniform than the grounding film formed by electroplating, vacuum evaporation or the like. As a result, the fluorine passivated film can be uniformly formed, thereby improving corrosion resistance to corrosive gas.

In this embodiment, distribution of phosphorus is not observed on the surface of the fluorine passivated film, but the distribution of phosphorus gradually increases towards the inside of the fluorine passivated film.

FIG. 1 shows distribution condition of fluorine and phosphorus on the surface and in the inside of the fluorine passivated film, which is the result detected by an electron spectroscopy for chemical analysis (ESCA). FIG. 1(A) is a diagram showing distribution condition of fluorine and FIG. 1(B) is a diagram showing distribution condition of phosphorus. In FIGS. 1(A) and 1(B), the axis of ordinates shows etching time (minute) from the surface of the fluorine passivated film, and the axis of abscissas shows binding energy proper to a chemical element. According to these graphs, if the maximum value appears within a short time period of etching, the relevant element is distributed in the vicinity of the surface of the film. On the contrary, if the maximum value appears after a fairly long time period of etching, the relevant element is distributed not in the vicinity of the surface of the film but only in the inside of the film.

As apparent from FIG. 1(A), fluorine (F) is distributed on the surface and in the vicinity of the surface of the fluorine passivated film, but is not distributed in the inside thereof.

On the contrary, as shown in FIG. 1(B), phosphorus (P) is not distributed on the surface and in the vicinity of the fluorine passivated film, but is distributed in gradually greater quantities toward the inside thereof. Incidentally, the boundary between the nickel-phosphorus plating film and the fluorine passivated film is not clearly distinguished.

Figure 2:
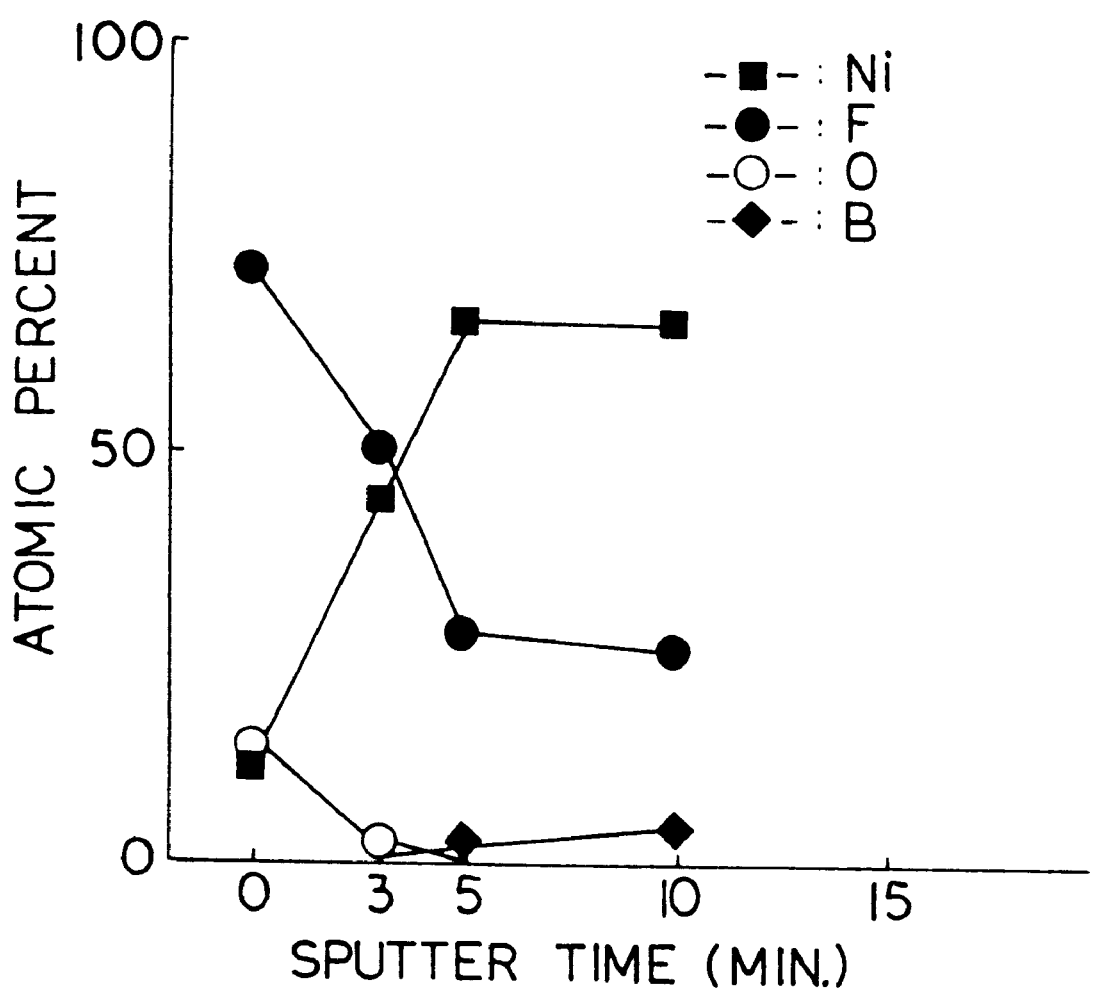
FIG. 2 is a diagram showing distribution condition of fluorine and boron.

FIG. 2 shows the distribution condition of fluorine and boron, detected by the ESCA, on the surface and in the inside of the fluorine passivated film in the case where the nickel-boron alloy film is formed on the substrate instead of the nickel-phosphorus alloy plating film, and then fluoridation is performed. Nickel and oxygen are simultaneously detected in this analysis.

As apparent from FIG. 2, fluorine (F) is distributed in a great quantities on the surface and in the vicinity of the fluorine passivated film, and distributed in less quantities toward the inside thereof. On the contrary, boron (B) is not distributed on the surface and in the vicinity of the fluorine passivated film, but is distributed in greater quantities toward the inside thereof.

Figure 3:
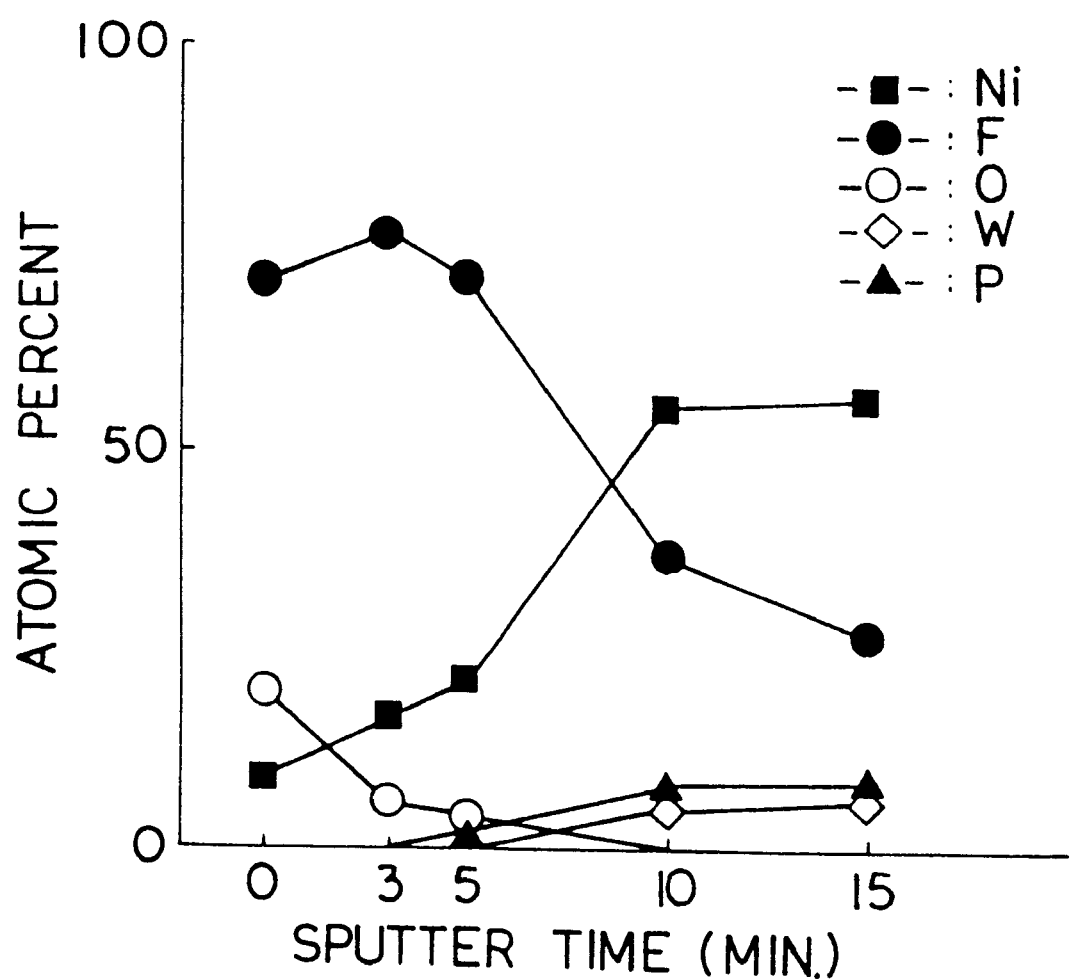
FIG. 3 is a diagram showing distribution condition of fluorine, tungsten and phosphorus.

FIG. 3 shows the distribution condition of fluorine, tungsten and phosphorus, detected by the ESCA, on the surface and in the inside of the fluorine passivated film in the case where the nickel-tungsten-phosphorus alloy plating film is formed on the substrate instead of the nickel-phosphorus alloy plating film, and then fluoridation is performed. Nickel and oxygen are simultaneously detected in this analysis as well as FIG. 2.

As apparent from FIG. 3, fluorine (F) is distributed in great quantities on the surface and in the vicinity of the fluorine passivated film, and distributed in less quantities toward the inside thereof. On the contrary, tungsten (W) and phosphorus (P) is not distributed on the surface and in the vicinity of the fluorine passivated film, but is distributed in greater quantities toward the inside thereof.

FIG. 4(A) shows the thickness of fluoride in the case where the nickel alloy film containing nickel, semimetal and/or other metal whose fluoride becomes a volatile compound is not formed on the substrate, but only the nickel film is formed, and then metallic fluoride ($NiF_2$) is formed on the surface thereof. According to FIG. 4(A), in case of sputtering time for 10 minutes in proportion to depth from the surface, the content of fluorine lowers up to 11%. This represents distribution of a small quantity of fluorine in this depth.

On the other hand, FIG. 4(B) shows the thickness of metallic fluoride in the case where the nickel-phosphorus alloy film containing 8% phosphorus, which is nickel alloy film containing nickel and other metal whose fluoride becomes a volatile compound or semimetal, is formed on the substrate, and then metallic fluoride is formed on the surface thereof. According to FIG. 4(B), in case of sputtering time for 10 minutes in proportion to depth from the surface, the content of fluorine is approximately 29%. This still represents distribution of a sufficient quantity of fluorine in this depth.

According to FIGS. 4(A) and 4(B), the nickel alloy film containing nickel, semimetal and/or other metal whose fluoride becomes a volatile compound is formed on the substrate, thereby thickening film of the metallic fluoride.

Next, the test result of corrosion resistance to corrosive gas in an example of industrial material with fluorine passivated film will be described below.

The substrate used aluminum or aluminum alloy in this example. After the said fluoridation treatment, the substrate was kept in gas atmosphere comprising 5 volume % of HF, 1 volume % of $H_2O$ and 94 volume % of $N_2$ for 72 hours, or in $Cl_2$ gas atmosphere of gauge pressure 2 kg/cm² for 7 days, and then the surface of the substrate was observed by an electron microscope. This test result proved that corrosion of the substrate was not observed in both cases, and corrosion resistance to corrosive gas was extremely high.

Further, after keeping the substrate in wet gas atmosphere comprising 1 volume % of $H_2O$ and 99 volume % of $Cl_2$, at 100° C. for 30 days, the surface of the substrate was observed by the electron microscope as well. The test result proved that corrosion of the substrate was not observed and corrosion resistance to corrosive gas was extremely high.

The above test results and other test results are as follows:

The result was evaluated by whether or not change occurs by observing by microscope and the naked eyes.

| Test items | Test condition | Test result |
|---|---|---|
| Corrosion resistance to chlorine gas | $Cl_2$: 2kg/cm 7 day's contact | Remain unchanged |
| Corrosion resistance to wet chlorine gas | $Cl_2$: 99 volume% $H_2O$: 1 volume% 100° C. 30 day's contact | Remain unchanged Remain unchanged Remain unchanged |
| Corrosion resistance to hydrogen fluoride mixed gas | HF: 5 volume % $N_2$: 94 volume % $H_2O$: 1 volume % 72 hours' contact at room temp. | Remain unchanged |
| Contact test to saturated hydrochloric acid vapor | Contact to 12N-HCl saturated vapor for 1 hour | Remain unchanged |
| Corrosion resistance to sulfuric acid | $H_2SO_4$: 20 volume % soak for 72 hours at room temp. | Remain unchanged |
| Corrosion resistance to Ga | Contact to melted metal Ga for 5 min. at 60° C. | Remain unchanged |
| Corrosion resistance to water | Solubility to super pure water: After soaking for 100 hours at room temp. | Not dissolved |

Accordingly, when an industrial material (using aluminum or aluminum alloy as a substrate) on which fluorine passivated film is formed is used in semiconductor manufacturing devices, excimer laser devices or halogen gas devices, corrosion to the above devices can be prevented, pollution of atmosphere caused by corrosion of devices can be also prevented, working precision and reliability of the devices can be improved.

In the embodiment, only metal material such as metal and metal alloy as a substrate are used and explained, however, nonmetal material such as plastics or ceramics may be used, that is, the grounding treatment, formation of film, and fluoridation may be carried out in the same way as mentioned above.

Further, the industrial material with fluorine passivated film according to the present invention is applicable to gas cylinders, gas holders, pipes, valves, RIE, CVD, excimer laser oscillators or the like.

As apparent from the above description, according to the present invention, since the nickel alloy film containing nickel, semimetal and/or other metal whose fluoride becomes a volatile compound is formed on the substrate, the nickel alloy film becomes stable by the presence of said other metal or semimetal. The thick fluorine passivated film can be formed by the presence of said other metal or semimetal.

Further, since said other metal or semimetal is not exposed on the surface of the fluorine passivated film, the fluorine passivated film is applicable to the industrial material in semiconductor manufacturing field without any bad influence.

In case of using metal or plastics as a substrate, corrosion resistance can be improved. On the other hand, in case of using plastics or ceramics as a substrate, gas released from the surface of the substrate can be prevented and conductivity can also be obtained.

Although certain preferred embodiments have been shown and described, it should be understood that many changes and modifications may be made therein without departing from the scope of the appended claims.

What is claimed is:

1. A process of manufacturing an industrial material comprising the steps of:

performing grounding treatment of a surface of a substrate;

forming a nickel alloy film on said surface of said substrate, said nickel alloy film containing nickel semi-metal and/or metal; and forming a fluorine passivated film on said nickel alloy film.

2. The process of manufacturing an industrial material as recited in claim 1, wherein said nickel alloy film is formed by an electroless plating.

3. The process of manufacturing an industrial material as recited in claim 1, wherein said substrate comprises metal or metal alloy.

4. The process of manufacturing an industrial material as recited in claim 1 wherein said substrate comprises ceramics or plastics.

5. The process of manufacturing an industrial material as recited in claim 1, wherein said nickel alloy film comprises a nickel-phosphorus alloy film.

6. The process of manufacturing an industrial material as recited in claim 1, wherein said nickel alloy film comprises a nickel-boron alloy film.

7. The process of manufacturing an industrial material as recited in claim 1, wherein said nickel alloy film comprises nickel-tungsten-phosphorus alloy film.

* * * * *